United States Patent [19]
Miguelez et al.

[11] Patent Number: 6,107,885
[45] Date of Patent: Aug. 22, 2000

[54] WIDEBAND LINEAR GAASFET TERNATE CASCODE AMPLIFIER

[75] Inventors: Philip Miguelez, Warminster; Rudolph J. Menna, Harleysville, both of Pa.

[73] Assignee: General Instrument Corporation, Horsham, Pa.

[21] Appl. No.: 09/236,175

[22] Filed: Jan. 25, 1999

[51] Int. Cl.$^7$ ........................................................ H03F 3/26
[52] U.S. Cl. ............................................. 330/276; 330/311
[58] Field of Search ..................................... 330/264, 269, 330/276, 275, 311

[56] References Cited

U.S. PATENT DOCUMENTS

| | | | |
|---|---|---|---|
| 3,254,302 | 5/1966 | Boykin et al. | 330/15 |
| 4,097,814 | 6/1978 | Cohn | 330/286 |
| 4,107,619 | 8/1978 | Pass | 330/255 |
| 4,595,881 | 6/1986 | Kennan | 330/54 |
| 4,706,038 | 11/1987 | Navidi et al. | 330/271 |

OTHER PUBLICATIONS

Fenney, RF Linear Hybrid Amplifiers, Two Sources Of A New Family Of Medium Power Broadband Gain Blocks For RF Applications, *Motorola RF Device Data*, pp. 204–207 (Undated Prior Art).

McNamara et al., 750 MHz Power Doubler And Push–Pull CATV Hybrid Modules Using Gallium Arsenide, *California Eastern Laboratories, Automated Fax Information*, 8 pages, (Dated 1996).

McNamara, Cable '96: Push–Pull and Power Doubler Amplifiers Using Gallium Arsenide, *California Eastern Labs, Automated Fax Information*, 4 pages, (Dated 1996).

Miguelez et al., The Advantages of Gallium Arsenide Hybrid Power Amplifier Technology In Cable Television Applications, 13 pages, (Dated Jan. 27, 1998).

*Primary Examiner*—Robert Pascal
*Assistant Examiner*—Henry Choe
*Attorney, Agent, or Firm*—Volpe and Koenig, P.C.

[57] ABSTRACT

The present invention incorporates GaAs field effect transistors (GaAsFETs) in a radio frequency (RF) ultra-linear amplifier. The described amplifier circuit is a transformer-coupled single input, signal processing unit incorporating ultra-fast, GaAsFETs in a three active device cascode. This arrangement allows for a higher working voltage to be applied across the three semiconductors rather than a traditional two transistor cascode. The operational bandwidth can process a mixed modulation signal comprised of analog and digital channels.

8 Claims, 2 Drawing Sheets

WIDEBAND LINEAR GAASFET TERNATE CASCODE AMPLIFIER

BACKGROUND OF THE INVENTION

1. Field of the Invention

This invention relates generally to electronic amplifiers. More particularly, the invention relates to a wide bandwidth radio frequency hybrid amplifier.

2. Description of the Related Art

Lowering distortion in solid state power amplifier circuits without compromising their transient response is an omnipresent problem. High frequency amplification is widely used in communications and broadcasting and also where high-speed switching is required for use in digital instrumentation. However, high frequency amplifier applications extend linear operation into areas where parasitic effects of interelectrode capacitance, wire inductance, stored charge and even operating frequency wavelength begin to adversely effect and dominate circuit behavior. Most amplifier topologies show a rolloff of gain with increasing signal frequency due to the effects of load and junction capacitance.

Load capacitance is not the only adverse effect when designing for high frequency operation. One important aspect that has serious impact on high speed and high frequency circuits is the existence of capacitance in the external circuit and in the transistor junctions themselves. The subtle effects of capacitance witnessed at low frequencies often dominate circuit behavior at high frequencies. This effect of increasing capacitance is known as the Miller effect.

To counteract the Miller effect, the active devices are operated in a mode known as cascode which increases bandwidth through a reduction in Miller capacitance and provides additional isolation between the source, the power supply, and the gain circuitry. While cascading is known to those skilled in the art of electronics, to ameliorate or eliminate the effects of the Miller capacitance, most designs such as those used in military communications, commercial wireless and CATV hybrids employ straight forward topologies or have been used in predominantly narrowband applications.

Familiar devices such as bipolar silicon transistors and silicon field effect transistors are still used to amplify radio frequencies. However, silicon technology is reaching its upper limits of acceptable low distortion operation. Gallium arsenide devices are noted for their hyper fast forward and soft reverse recovery characteristics with low stored charge. Another fact favoring gallium arsenide devices is that the device parameters are stable over a wide temperature range.

As an example, FIG. 1 shows a plot comparing the performance of gallium arsenide (GaAs) devices substituting for silicon (Si) devices in the same push-pull amplifier circuit. The composite triple beat distortion, dBc (dB reference to a carrier) levels per power output dBmV are improved using the GaAs devices. The use of GaAs technology for the active signal components maintains high gain while offering lower distortion figures and excellent linearity. However, mere substitution of a GaAs device into the same circuit topology optimized for bipolar silicon transistors or metal oxide semiconductor field effect transistors (MOSFETs) fails to fully capitalize on GaAs metal semiconductor field effect transistor (MESFET) potential. As discussed earlier, a standard hybrid amplifier arranged as a transformer-coupled cascode, balanced push-pull, using silicon technology typically incorporates paralleled cascoded devices to obtain higher output levels while maintaining low distortion figures. Prior art attempts to substitute GaAs devices base their designs on the same circuit topologies relying on traditional common-source common-gate cascodes. While achieving improved distortion compared to silicon technology, to meet the same system specifications, a compromise regarding performance, operating conditions or additional circuit complexity would be required.

A simple circuit topology for a wide bandwidth, ultra-linear amplifier with a frequency response extending to 1,000 MHz and beyond that exploits the performance of GaAs technology is desired.

SUMMARY OF THE INVENTION

The present invention incorporates GaAs field effect transistors (GaAsFETs) in a radio frequency (RF) ultra-linear amplifier. The described amplifier circuit is transformer-coupled using impedance matching transformers at the input and output. The amplifier is a single input, signal processing unit incorporating ultra-fast, GaAsFETs in a three active device cascode allowing for a higher working voltage to be applied across the three devices. High gain, high bandwidth (>1,000 MHz), GaAs semiconductors are selected through noise and curve-trace linear analysis. The operational bandwidth can process a mixed modulation signal comprised of analog and digital channels. The amplifier has a frequency response from 50 through 1,000 MHz.

Accordingly, it is an object of the present invention to provide an ultra-fast, ultra-linear, transformer-coupled cascode push-pull amplifier for expected frequencies from 50 through 1,000 MHz.

Other objects and advantages of the amplifier will become apparent to those skilled in the art after reading the detailed description of the preferred embodiment.

DESCRIPTION OF THE PREFERRED EMBODIMENTS

Figure 1:
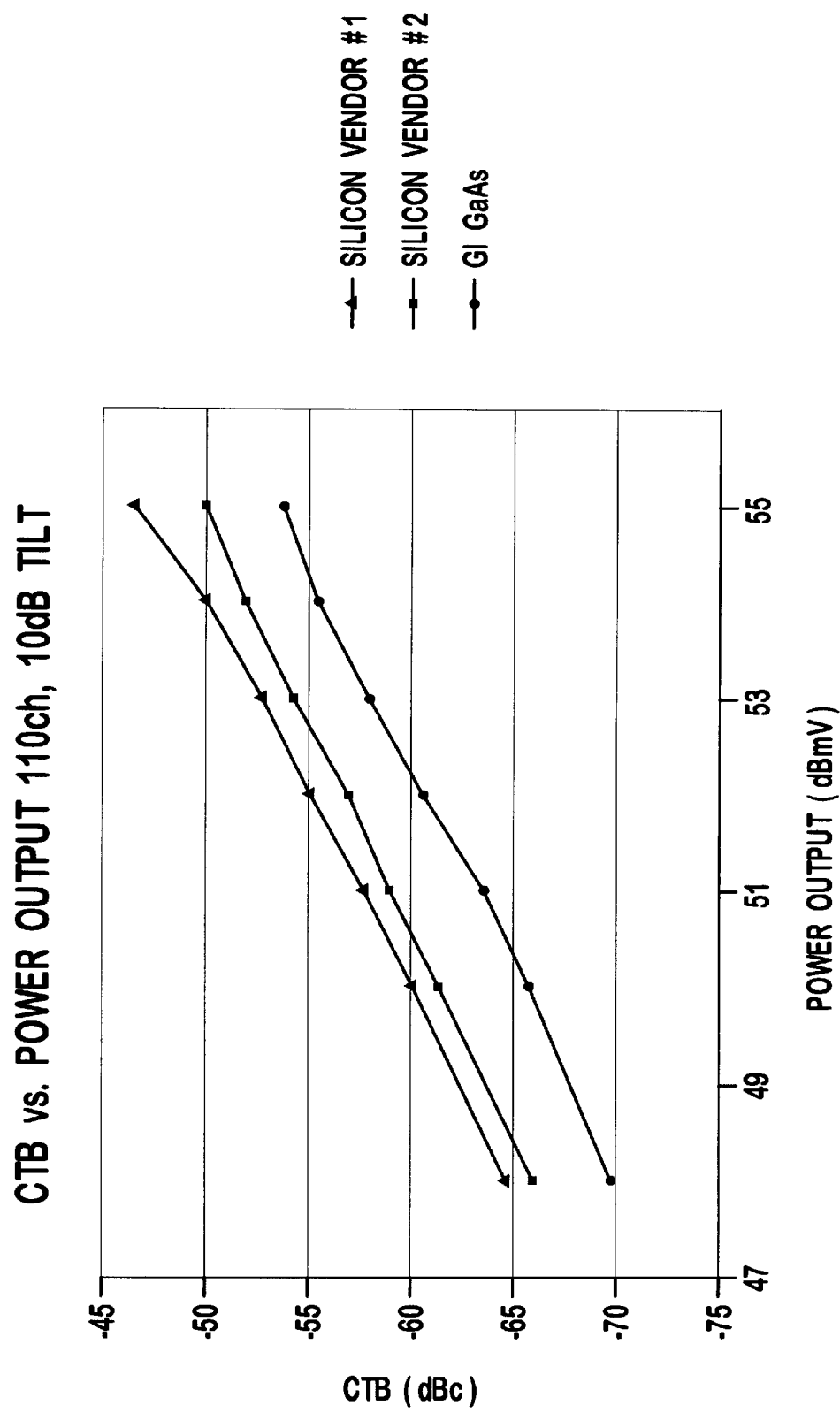
FIG. 1 is a plot comparing the performance of Si and GaAs semiconductors in the same push-pull amplifier topology.

The preferred embodiment will be described with reference to the drawing figures where like numerals represent like elements throughout.

Figure 2:
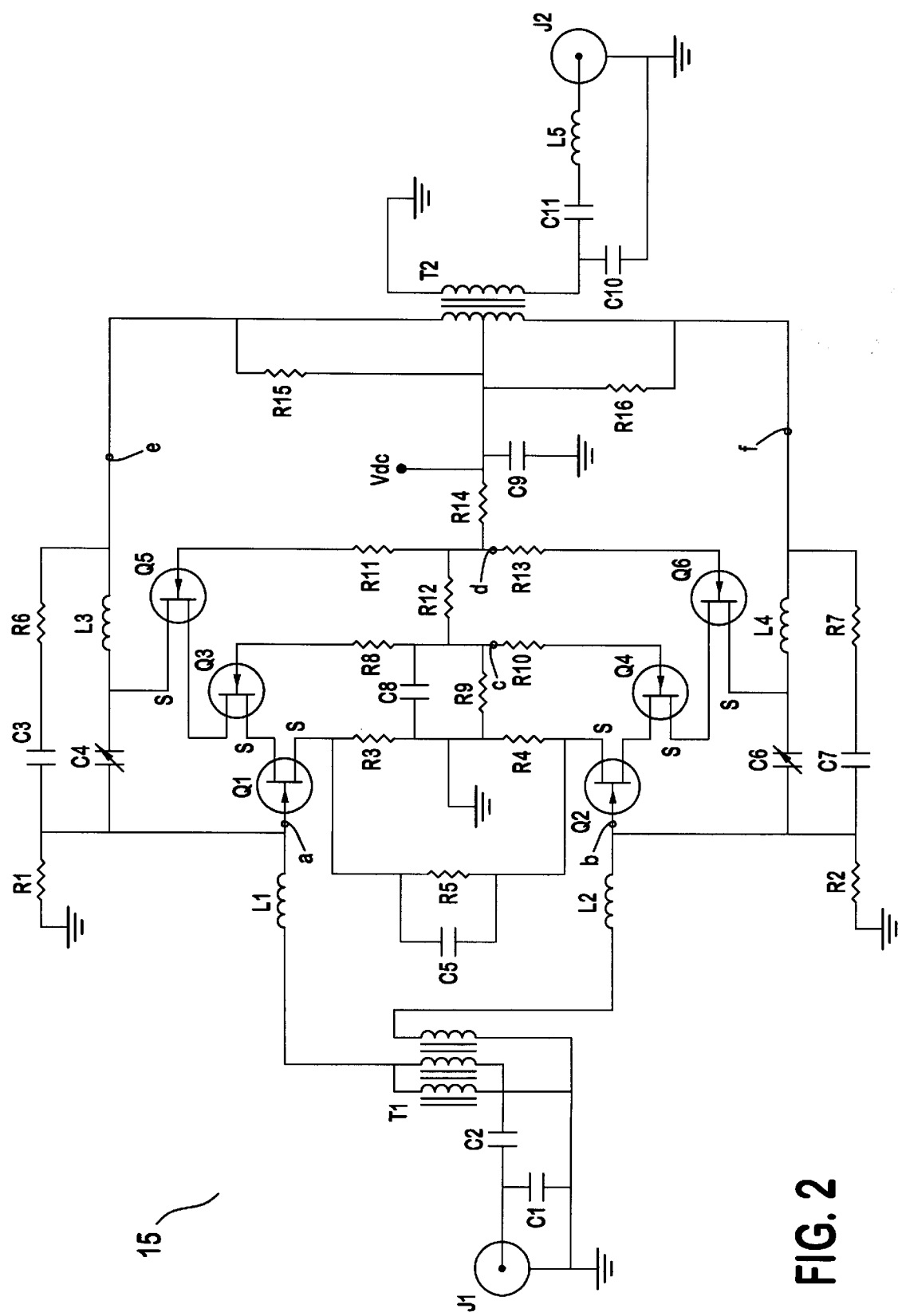
FIG. 2 is a schematic diagram of the present invention.

With reference to FIG. 2, the circuit topology of the preferred embodiment 15 is shown. An input signal with an expected bandwidth of 50 through 1,000 MHz at a level of −20 dBm to 0 dBm is applied to an input jack J1. The present invention has an input and output impedance of 75 Ω as seen at the input J1 or output J2 jacks. Coupled to the input jack is a filter comprised of capacitor C1 for adjusting the RF input impedance phase and amplitude and capacitor C2 providing a high-pass function for decoupling direct current. The output of the filter is coupled to an unbalanced-to-balanced wideband transformer T1 with a 1:1 impedance ratio which divides the input signal into two current paths with equal amplitude (−3 dB) but with a 180 degree phase shift. The input transformer T1 acts as a phase splitter which drives both cascoded active gain stages in a push-pull configuration. The outputs from the input transformer T1 are coupled to two inductors, L1 and L2, to counteract the internal capacitance of GaAsFETs Q1 and Q2 and therefore match the high reactive GaAsFET gate impedance.

The outputs of inductors L1 and L2 form nodes a and b which drive the first of three n-channel discrete GaAsFETs, Q1 and Q2 in a cascode configuration. The three FET cascode allows a higher working voltage to be applied since the voltage source is distributed across three devices rather than two as in the traditional two device cascode. While a cascode normally consists of a single common-source active device and a single common-gate active device, the addition of the novel intermediate common-gate device in the present invention allows for 3rd order distortion compensation by adjustment of the interstage impedance match between the first and third devices. Nodes a and b are connected to the gates of GaAsFETs Q1 and Q2 of the ternate cascode. Nodes a and b are also connected to a network consisting of C3, C4, L3 and R6 and, C6, C7, L4 and R7, respectively, which provide local feedback and frequency response shaping across each cascode. Resistors R1 and R2 provide a dc potential reference at the gates of Q1 and Q2, part of the single power supply self-bias circuit which also includes R3 (R1/R3) and R4 (R2/R4).

Each feedback network determines the gain near the bandwidth upper frequency. Since each amplifying device contributes its own high frequency rolloff, and since the sum of many of these rolloffs creates a complex, multi-pole phase lag, a system using large amounts of negative feedback tends to be unstable at high frequencies. The approach to reduce high frequency instability is to employ few amplifying devices as possible and establish low open loop gain. The simplicity and low gain therefore allows the circuit to respond to signals very quickly thus eliminating transient problems. By using a cascode circuit, the amplifying circuit yields good stability.

GaAsFETs Q1 and Q2 are common-source devices having each source s connected to resistors R3 and R4, respectively, which are coupled to ground. Resistors R3 and R4 determine the operating point or bias current flowing through transistors Q1 and Q2, and may be laser trimmed in dependance upon the individual characteristics of GaAsFETs Q1, Q3, Q5 and Q2, Q4, Q6 in the circuit. Also coupled to the source s connections of GaAsFETs Q1 and Q2 is a network comprising R5 and C6 that determines the gain at the lower-end of the operational bandwidth. R5 and C6 also correct voltage imbalances inherent in a push-pull configuration by providing a virtual ground connection between the symmetrical amplifier sections while providing frequency response compensation.

The intermediate and final gain devices Q3, Q4 and Q5, Q6 are connected in a common-gate configuration with resistors R8, R11 and R10 and R13. Node c between C8, R8, R9 and R10 and node d between R11, R12, R13 and R14 is coupled with resistor R12 which is part of a voltage divider comprised of R14, R12 and R9. Since the nominal supply voltage is impressed across R14, R12 and R9, the voltage division determines the voltage applied across each GaAsFET in the push-pull cascode. The voltage across GaAsFETs Q1 and Q2 and Q5 and Q6 determine the performance characteristics of the amplifier and determine the operating region of each active device. Capacitor C8 in parallel with resistor R9 provides additional noise isolation. To increase stability in the common gate devices Q3, Q4, Q5 and Q6, R8, R10 and R11, R13 ameliorate the connection inductance between the devices and contour the output impedance of the amplifier 15.

As one skilled in this art can recognize, the connection of transistor Q1 to Q3 and Q3 to Q5 (Q2 to Q4 and Q4 to Q6) are cascode connections wherein the voltage source maintains a constant voltage across transistor Q1 (Q2). The cascode used in the present invention is a common-source, common-gate, common-gate. First common-gate transistors Q3 and Q4 are used as an active impedance transformer providing an adjustable impedance match between the common-source input GaAsFETs Q1 and Q2 and the common-gate output GaAsFETs Q5 and Q6. To achieve the optimum in low noise 2nd order distortion, all GaAsFETs are individually curve-traced and matched. Additionally, the GaAsFETs in the presently preferred embodiment are manufactured by Siemens Semiconductor and have higher breakdown voltage characteristics and low leakage current as compared with other available GaAsFET vendors.

The output nodes e and f of each cascode active section are coupled to output transformer T2 which is a balance-to-unbalanced wideband transformer with an impedance ratio of 2:1. The 2:1 impedance ratio provides an optimum match for the selected GaAsFETs for low distortion operation. Transformer T2 exhibits excellent phase and amplitude balance characteristics and combines the 0° and 180° phase sections of the amplifier.

The positive supply voltage Vdc is coupled to a center tap which allows for the required voltage swings as Q1, Q3 and Q5 conduct on positive voltage swings and Q2, Q4 and Q6 conduct on negative voltage swings. Since transformer T2 is balanced, the 0° and 180° current swings cancel and do not cause magnetic core saturation of the transformer T2 to occur. The secondary or unbalanced side of transformer T2 is coupled to a filter comprising capacitors C10 and C11 and inductor L5. Capacitor C11 decouples any dc currents and determines the allowable bandwidth with inductor L5 coupled to output RF jack J2 and capacitor C10 providing additional output impedance matching.

The preferred embodiment described above is a three active device cascode using n-channel GaAsFETs. Alternatively, more than three active devices in each cascode can be used and complimentary n and p-channel semiconductors can be employed.

While the present invention has been described in terms of the preferred embodiment, other variations which are within the scope of the invention as outlined in the claims below will be apparent to those skilled in the art.

What is claimed is:

1. A wide bandwidth radio frequency amplifier comprising:
    an unbalanced-to-balanced transformer having a RF amplifier input for coupling with a RF input signal and first and second low level signal outputs;
    a first cascode having a low level signal input coupled to said unbalanced-to-balanced transformer first low level output and a high level signal output;
    a second cascode having a low level signal input coupled to said unbalanced-to-balanced transformer second low level output and a high level signal output;
    said first cascode having first, second and third stages coupled in a cascode configuration with a voltage source means in parallel therewith providing predetermined voltage drops across said first, second and third stages with said first stage including said low level signal input, said second stage providing impedance matching between said first and said third stages, and said third stage including said high level signal output;
    said second cascode having first, second and third stages coupled in a cascode configuration with said voltage source means in parallel therewith providing predetermined voltage drops across said first, second and third stages of said second gain stage with said first stage including said low level signal input, said second stage providing impedance matching between said first and said third stages, and said third stage including said high level signal output; and a balanced-to-unbalanced transformer having a first input coupled to said first gain stage output and a second input coupled to said second gain stage output and a RF amplifier output for coupling with a RF output terminal.

2. The RF amplifier according to claim 1 wherein said stages are GaAsFETs.

3. The RF amplifier according to claim 1 wherein said voltage source means comprises a voltage divider including first, second and third resistors.

4. The RF amplifier according to claim 2 wherein said first cascode conducts on positive portions of said RF input signal and said second cascode conducts on negative portions of said RF input signal.

5. The RF amplifier according to claim 2 wherein said first and second cascodes are n-channel devices.

6. The RF amplifier according to claim 2 wherein said first cascode includes n-channel devices and said second cascode includes p-channel devices.

7. The RF amplifier according to claim 6 wherein said stages associated with said first cascode are complimentary pairs with said stages associated with said second cascode.

8. The RF amplifier according to claim 1 where said configuration of said first and second cascodes is common-source, common-gate, common-gate.

* * * * *